(12) United States Patent
Liao et al.

(10) Patent No.: US 8,828,878 B2
(45) Date of Patent: *Sep. 9, 2014

(54) MANUFACTURING METHOD FOR DUAL DAMASCENE STRUCTURE

(75) Inventors: Duan Quan Liao, Singapore (SG); Yikun Chen, Singapore (SG); Xiao Zhong Zhu, Singapore (SG); Ching-Hwa Tey, Singapore (SG); Chen-Hua Tsai, Hsinchu County (TW); Yu-Tsung Lai, Taichung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 472 days.

This patent is subject to a terminal disclaimer.

(21) Appl. No.: 13/218,458

(22) Filed: Aug. 26, 2011

(65) Prior Publication Data

US 2012/0309199 A1      Dec. 6, 2012

Related U.S. Application Data

(63) Continuation-in-part of application No. 13/150,145, filed on Jun. 1, 2011, now Pat. No. 8,399,359.

(51) Int. Cl.
| | |
|---|---|
| *H01L 21/4763* | (2006.01) |
| *H01L 21/44* | (2006.01) |
| *H01L 21/311* | (2006.01) |
| *H01L 21/768* | (2006.01) |

(52) U.S. Cl.
CPC .... *H01L 21/31116* (2013.01); *H01L 21/76811* (2013.01); *H01L 21/76816* (2013.01); *H01L 21/31144* (2013.01)

USPC .......... 438/702; 438/638; 438/669; 438/671; 257/E21.215

(58) Field of Classification Search
CPC ................................................ H01L 21/76807
USPC ........... 438/638, 669, 671, 702; 257/E21.215
See application file for complete search history.

(56) References Cited

U.S. PATENT DOCUMENTS

| | | |
|---|---|---|
| 5,314,845 A | 5/1994 | Lee et al. |
| 5,362,526 A | 11/1994 | Wang et al. |
| 6,037,237 A | 3/2000 | Park et al. |

(Continued)

OTHER PUBLICATIONS

Lien et al., "Study of Etch Process Impact on Line Distortion", Jun. 3, 2003, p. 1-11.

(Continued)

*Primary Examiner* — Mohsen Ahmadi
(74) *Attorney, Agent, or Firm* — Winston Hsu; Scott Margo

(57) ABSTRACT

A manufacturing method for a dual damascene structure first includes providing a substrate having at least a dielectric layer, a first hard mask layer, a first cap layer, a second hard mask layer, and a second cap layer sequentially formed thereon, performing a first double patterning process to form a plurality of first trench openings and second trench openings in the second cap layer and the second hard mask, and the first layer being exposed in bottoms of the first trench openings and the second trench openings, performing a second double patterning process to form a plurality of first via openings and second via openings in the first cap layer and the first hard mask layer, and transferring the first trench openings, the second trench openings, the first via openings, and the second via openings to the dielectric layer to form a plurality of dual damascene openings.

17 Claims, 15 Drawing Sheets

(56) References Cited

U.S. PATENT DOCUMENTS

| | | |
|---|---|---|
| 6,221,759 B1 | 4/2001 | Bothra |
| 6,426,285 B1 | 7/2002 | Chen et al. |
| 6,534,414 B1 | 3/2003 | Wang et al. |
| 6,787,875 B2 | 9/2004 | Brennan |
| 6,790,770 B2 | 9/2004 | Chen et al. |
| 6,846,618 B2 | 1/2005 | Hsu et al. |
| 7,211,519 B2 | 5/2007 | Takigawa |
| 7,432,198 B2 | 10/2008 | Kim |
| 8,008,206 B2 | 8/2011 | Liang |
| 2003/0044725 A1 | 3/2003 | Hsue |
| 2005/0079706 A1 | 4/2005 | Kumar |
| 2005/0189612 A1 | 9/2005 | Hung |
| 2006/0030128 A1* | 2/2006 | Bu et al. ................ 438/462 |
| 2007/0020565 A1 | 1/2007 | Koh et al. |
| 2007/0166996 A1* | 7/2007 | Ponoth et al. .............. 438/622 |
| 2008/0020570 A1 | 1/2008 | Naik |
| 2010/0055897 A1* | 3/2010 | Chou et al. ................ 438/638 |
| 2011/0070738 A1 | 3/2011 | Liang |

OTHER PUBLICATIONS

Steven Vitale et al., "2P2E requires some type of hardmask", Nov. 30, 2007, p. 1-2.

Wei-Chih Chen et al., "Improvement of Cu void in specific pattern by tensile hard mask film", Invention disclosure, Aug. 7, 2008, p. 1-13.

Guang-Yaw Hwang et al., "Double patterning and CD shrinkage for small trench CD and Pitch control", Invention disclosure, Sep. 22, 2009, p. 1-8.

An Chi Liu, "Sandwich structure in BEOL hard mask process", Invention disclosure, Dec. 8, 2009, p. 1-6.

* cited by examiner

US 8,828,878 B2

MANUFACTURING METHOD FOR DUAL DAMASCENE STRUCTURE

CROSS REFERENCE TO RELATED APPLICATIONS

This is a continuation-in-part of U.S. application Ser. No. 13/150,145 that was filed on Jun. 1, 2011 and is included herein by reference.

BACKGROUND OF THE INVENTION

1. Field of the Invention

The present invention relates generally to a manufacturing method for a damascene structure, more particularly, to a manufacturing method for a damascene structure adopting double patterning technique (DPT).

2. Description of the Prior Art

In the fabrication of semiconductor integrated circuits (ICs), semiconductor devices are generally connected by several metallic interconnecting layers commonly referred to as multi-level interconnects, and damascene process has been deemed a convenient and predominant method for forming the multi-level interconnects. Principally, the damascene process includes etching a dielectric material layer to form trench and/or via patterns, filling the patterns with conductive materials such as copper, and performing a planarization process. Thus a metal interconnect is obtained.

On the other hand, photolithography is an essential process in the fabrication of semiconductor ICs. Principally, the photolithography is to form designed patterns such as implantation patterns or layout patterns on at least a photomask, and then to precisely transfer such patterns to a photoresist layer by exposure and development steps. Subsequently, by performing semiconductor processes such as ion implantation, etching process, or deposition, the complicated and sophisticated IC structure is obtained.

Along with miniaturization of semiconductor devices and progress in fabrication of semiconductor device, conventional lithography process meets the bottleneck due to printability and manufacturability. To meet the requirements of device design rules which continue to push the resolution limits of existing processes and tooling, double patterning technique (DPT) is developed and taken as one of the most promising lithography technologies for 32 nanometer (nm) node and 22 nm node patterning since it can increase the half-pitch resolution by up to two times using current infrastructures.

SUMMARY OF THE INVENTION

According to an aspect of the present invention, a manufacturing method for a dual damascene structure is provided. The manufacturing method first provides a substrate having at least a dielectric layer, a first hard mask layer, a first cap layer, a second hard mask layer, and a second cap layer sequentially formed thereon. Then a first double patterning process is performed to sequentially form a plurality of first trench openings and a plurality of second trench openings in the second cap layer and the second hard mask, and the first cap layer being exposed in bottoms of the first trench openings and the second trench openings. After forming the first trench openings and the second trench openings, a second double patterning process is performed to sequentially form a plurality of first via openings and a plurality of second via openings in the first cap layer and the first hard mask layer. Next, the first trench openings, the second trench openings, the first via openings, and the second via openings are transferred to the dielectric layer to form a plurality of dual damascene openings.

According to the manufacturing method for a dual damascene structure provided by the present invention, the trench openings and the via openings of the damascene openings are both formed by performing double patterning process. Therefore pattern failure such as the trench openings connecting issue and/or the via openings connecting issue are avoided even the minimum space between the adjacent trench openings and the minimum space between the adjacent via openings are kept shrinking. Simultaneously, the pattern accuracy is improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-10 are schematic drawings illustrating a method for manufacturing a dual damascene structure provided by a first preferred embodiment of the invention, wherein

FIGS. 11-21 are schematic drawings illustrating a method for manufacturing a dual damascene structure provided by a second preferred embodiment of the invention, wherein

DETAILED DESCRIPTION

Figure 1:
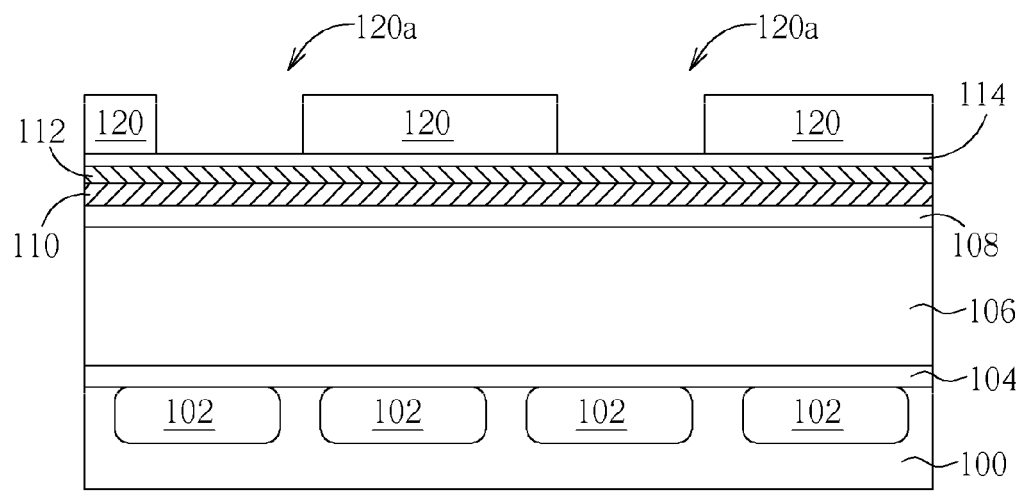
Figure 6A:
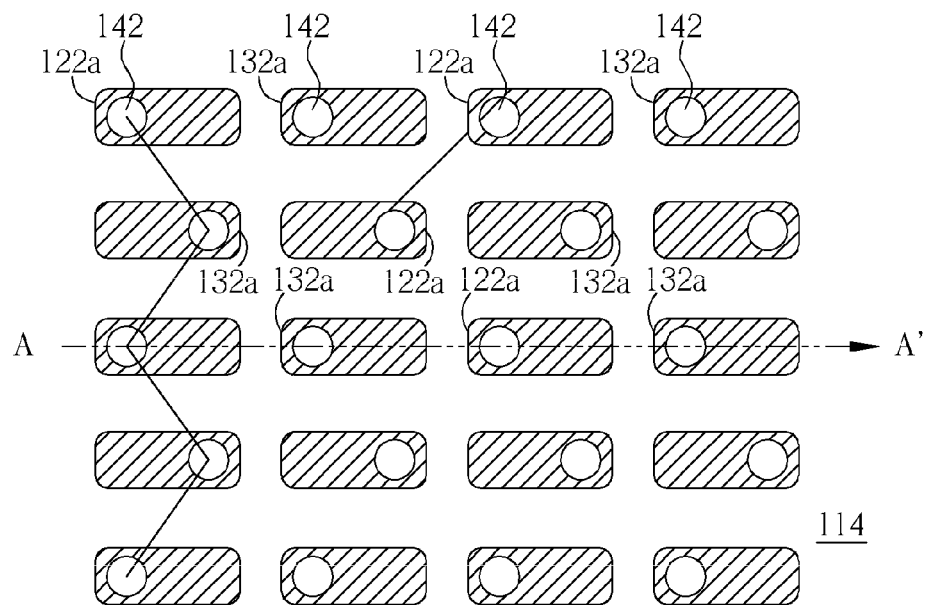
Figure 6B:
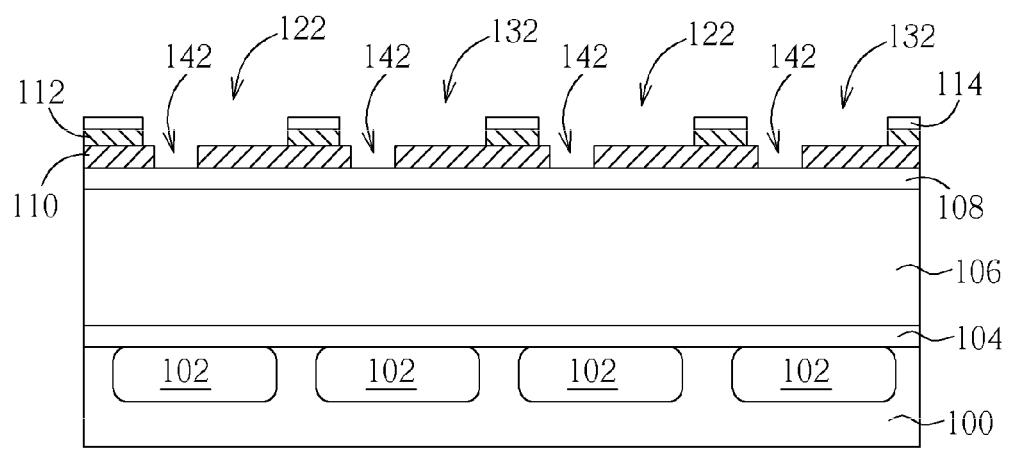
Figure 7:
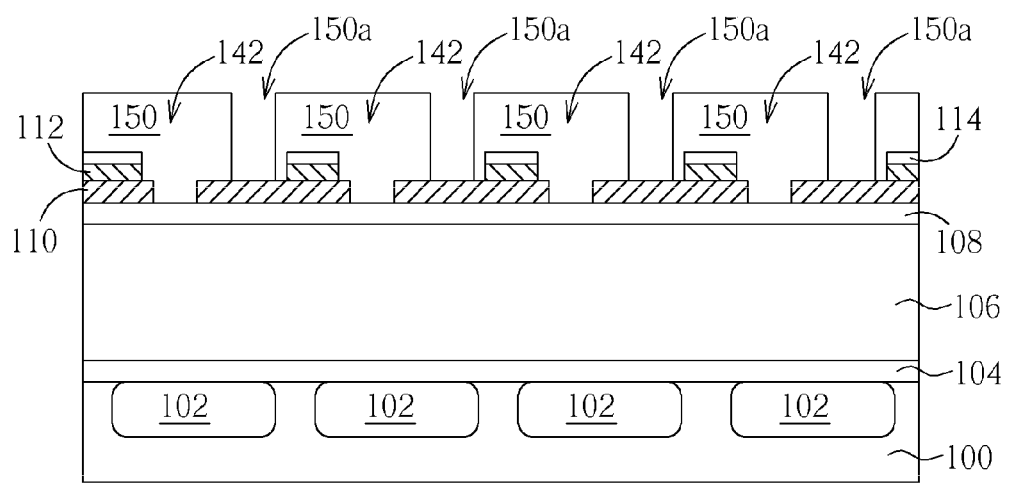
Figure 8A:
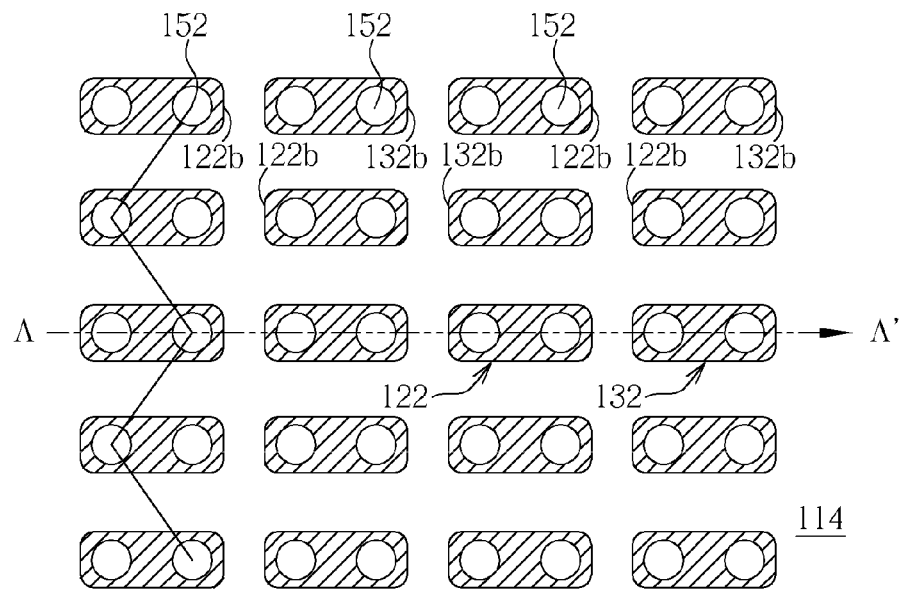

Please refer to FIGS. 1-10, which are schematic drawings illustrating a method for manufacturing a dual damascene structure provided by a first preferred embodiment of the invention, wherein FIGS. 2B, 4B, 6B, and 8B are cross-sectional view respectively taken along line A-A' of FIGS. 2A, 4A, 6A, and 8A and FIGS. 9-10 are cross-sectional view respectively taken along line A-A' of FIG. 8A. As shown in FIG. 1, the preferred embodiment provides a substrate 100 having a plurality of conductive layers 102 formed therein. And a base layer 104 covering the conductive layers 102 is formed on the substrate 100. Subsequently, a dielectric layer 106, a cap layer 108, a first hard mask layer 110, and a second hard mask layer 112 are sequentially formed on the substrate 100. The dielectric layer 106 can include low dielectric constant (low-K) material (K value smaller than 3.9), ultra low-K (ULK) material (K value smaller than 2.6), or porous ULK material. Because the low-K material, the ULK material, and the porous ULK material are not dense material and all possess low structural strengths, a dense cap layer 108 is formed on the dielectric layer 106 to provide protection according to the preferred embodiment. The cap layer 108 can be a single-layered structure including silicon oxide (SiO), silicon oxynitride (SiON), or tetraethylorthosilicate (TEOS) as shown in FIG. 1, or a multi-layered structure.

Please refer to FIG. 1 again. In accordance with the preferred embodiment, an etching rate of the first hard mask layer 110 is different from an etching rate of the second hard mask layer 112. For example, the first hard mask layer 110 includes an insulating hard mask layer such as a SiON hard mask layer while the second hard mask layer 112 includes a metal hard mask layer such as a titanium nitride (TiN) hard mask layer. On the second hard mask layer 112, another cap layer 114 is selectively formed. The cap layer 114 can be a single-layered structure including SiON or SiO or a multi-layered structure.

Figure 2A:
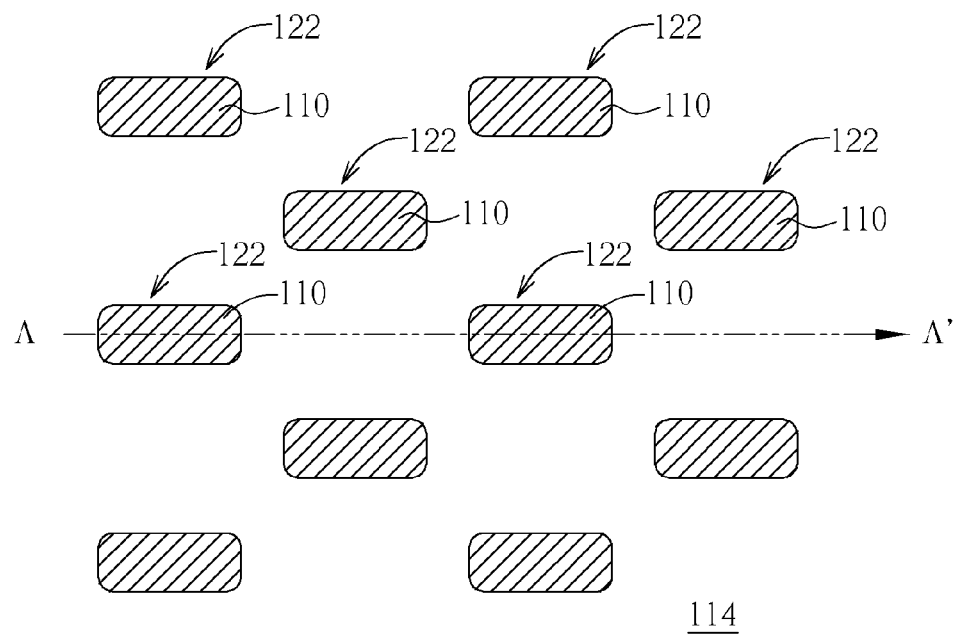
Figure 2B:
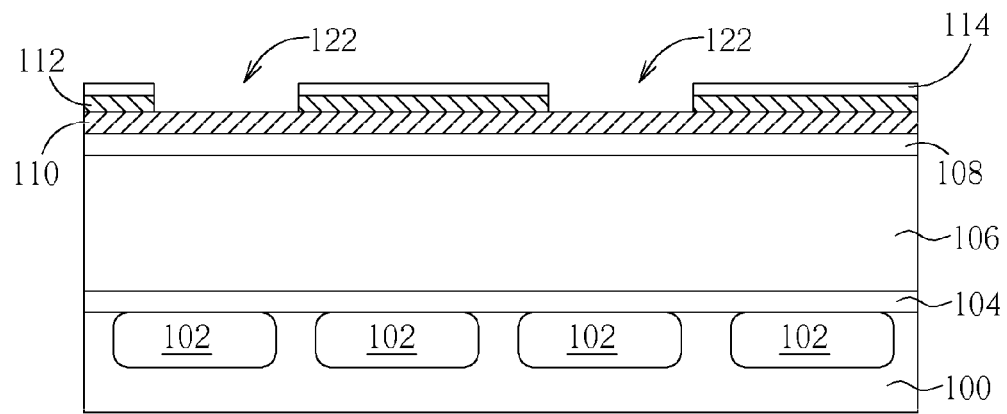
FIGS. 2B, 4B, 6B, and 8B are cross-sectional view respectively taken along line A-A' of FIGS. 2A, 4A, 6A, and 8A and FIGS. 9-10 are cross-sectional view respectively taken along line A-A' of FIG. 8A.

Please refer to FIGS. 1-2B. In order to clearly describe the step of the preferred embodiment, FIG. 2A and FIG. 2B should be referred together. Next, a first double patterning process is performed. In detail, a first photoresist 120 is formed on the cap layer 114 and followed by performing a first photolithography step to pattern the first photoresist 120. Thus a plurality of first openings 120a for defining trench openings of damascene structures is obtained. Then, a first etching step is performed to etch the cap layer 114 and the second hard mask layer 112 through the first openings 120a with a chlorine ($Cl_2$) gas. Consequently, the first openings 120a are transferred to the cap layer 114 and the second hard mask layer 112 to form a plurality of first trench openings 122 as shown in FIG. 2A and FIG. 2B. According to the preferred embodiment, the first etching step spontaneously stops at the first hard mask layer 110 as shown in FIG. 2B because the etching rate of the first hard mask layer 110 is different from the etching rate of the second hard mask layer 112. Additionally, the first photoresist 120 is consumed and removed from the substrate 100 during the first etching step, is removed after the first etching step.

Figure 3:
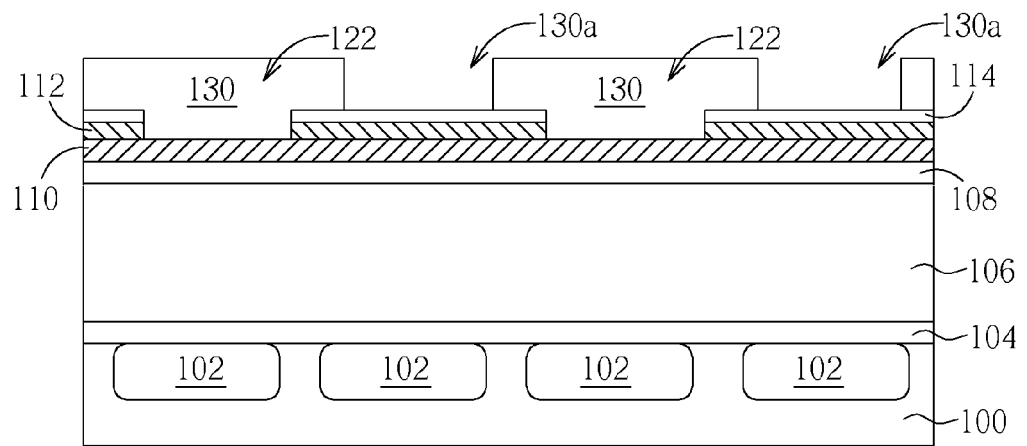
Figure 4A:
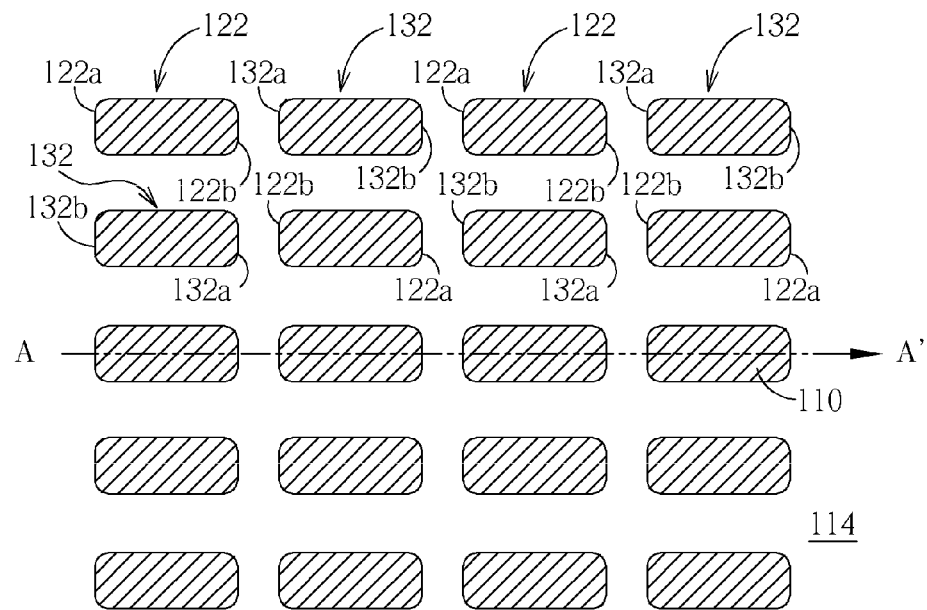
Figure 4B:
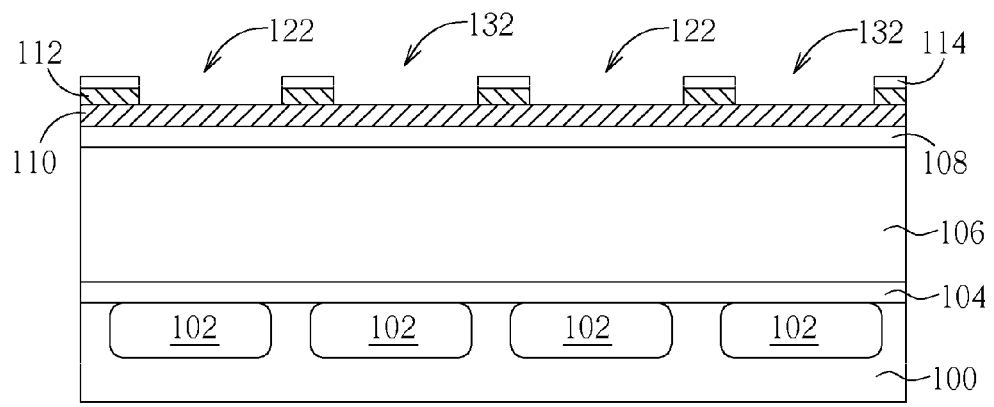

Please refer to FIGS. 3-4B, wherein FIG. 4A and FIG. 4B should be referred together in order to clearly describe the step of the preferred embodiment. After forming the first trench openings 122, a second photoresist 130 is formed on the cap layer 114 and in the first trench openings 122, and followed by performing a second photolithography step. Thus the second photoresist 130 is patterned to form a plurality of second openings 130a for defining trench openings of damascene structures as shown in FIG. 3. Next, a second etching step is performed to etch the cap layer 114 and the second hard mask layer 112 through the second openings with a $Cl_2$ gas. Thus, the second openings 130a are transferred to the cap layer 114 and the second hard mask layer 112 to form a plurality of second trench openings 132 as shown in FIG. 4A and FIG. 4B. As mentioned above, the second etching step spontaneously stops at the first hard mask layer 110 as shown in FIG. 4B because the etching rate of the first hard mask layer 110 is different from the etching rate of the second hard mask layer 112. It is noteworthy that $Cl_2$ gas is used in both the first etching step and the second etching step because its etching rate to the first hard mask layer 110 (including SiON in the preferred embodiment) is significantly different from its etching rate to the second hard mask layer 112 (including TiN in the preferred embodiment), and thus both the first etching step and the second etching step spontaneously stop at the first hard mask layer 110 as shown in FIG. 2B and FIG. 4B. However, those skilled in the art would easily realize that suitable etching gas or etchant that having different etching rates between the first hard mask layer 110 and the second hard mask layer 112 can be used in the first etching step and the second etching step. Additionally, the second photoresist 130 is consumed and removed from the substrate 100 during the second etching step, or is removed after the second etching step.

Please refer to FIGS. 3-4B again. According to the preferred embodiment, the first double patterning process is performed to form the first trench openings 122 and the second trench openings 132 in the cap layer 114 and the second hard mask layer 112, thus the first hard mask layer 110 is exposed respectively in bottoms of the first trench openings 122 and the second trench openings 132 as shown in FIG. 4B. It is noteworthy that the first trench openings 122 and the second trench openings 132 are arranged in a matrix as shown in FIG. 4A. More important, the first trench openings 122 and the second trench openings 132 are staggered. In other words, a second trench opening 132 is positioned between any adjacent first trench openings 122 in any rows or columns. In the same concept, a first trench opening 122 is positioned between any adjacent second trench openings 132 in any rows or columns.

Please refer to FIG. 4A again. It is noteworthy that after the first double patterning process, a the first end 122a of the first trench opening 122 and a second end 122b of the first trench opening 122 are further defined as shown in FIG. 4A. In the same concept, a first end 132a of the second trench opening 132 and a second end 132b of the second trench opening 132 are further defined as shown in FIG. 2A. More important, the first end 122a of each first trench opening 122 is corresponding to the second end 132b of each second trench opening 132, and the second end 122b of each first trench opening 122 is corresponding to the first end 132a of the second trench opening 132 according to the preferred embodiment.

Figure 5:
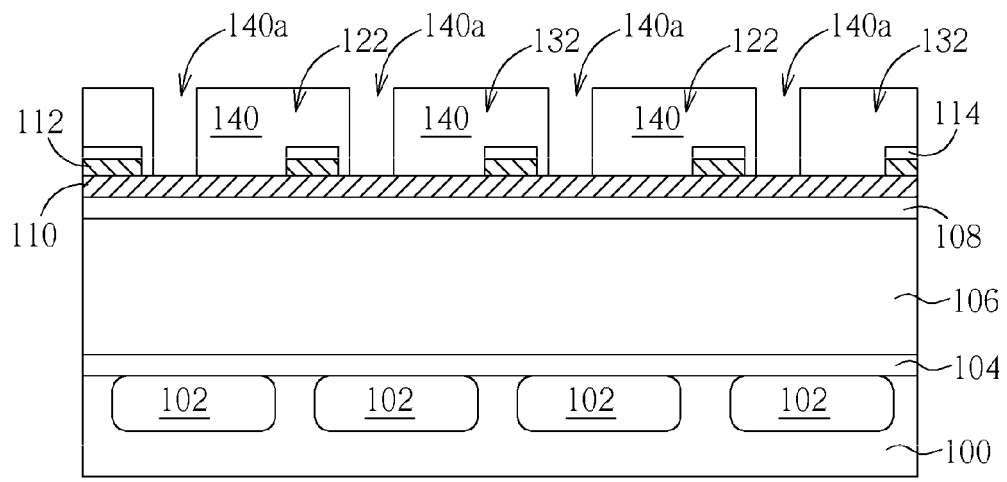

Please refer to FIGS. 5-6B, wherein FIG. 6A and FIG. 6B should be referred together in order to clearly describe the step of the preferred embodiment. After the first double patterning process, a second double patterning process is performed. In detail, a third photoresist 140 is formed on the cap layer 114 and in the first trench openings 122 and the second trench openings 132. Next, a third photolithography step is performed to form a plurality of third openings 140a for defining via openings of damascene structures in the third photoresist 140 as shown in FIG. 5. Subsequently, a third etching step is performed to etch the first hard mask layer 110 through the third openings 140a with a methyl fluoride ($CH_3F$) gas. Thus the third openings 140a are transferred to the first hard mask layer 110 and a plurality of first via openings 142 is formed as shown in FIG. 6A and FIG. 6B. Additionally, the third photoresist 140 is consumed and removed from the substrate 100 during the third etching step, or is removed after the third etching step.

Please refer to FIG. 6A again. It is noteworthy that according to the preferred embodiment, all of the first via openings 142 are formed in the first end 122a of the first trench openings 122 and the first end 132a of the second trench openings 132. Since the first trench openings 122 and the second trench openings 132 are arranged in a matrix, a connecting line of the first via openings 142 in any column comprises a piecewise linear line as shown in FIG. 6A.

Figure 8B:
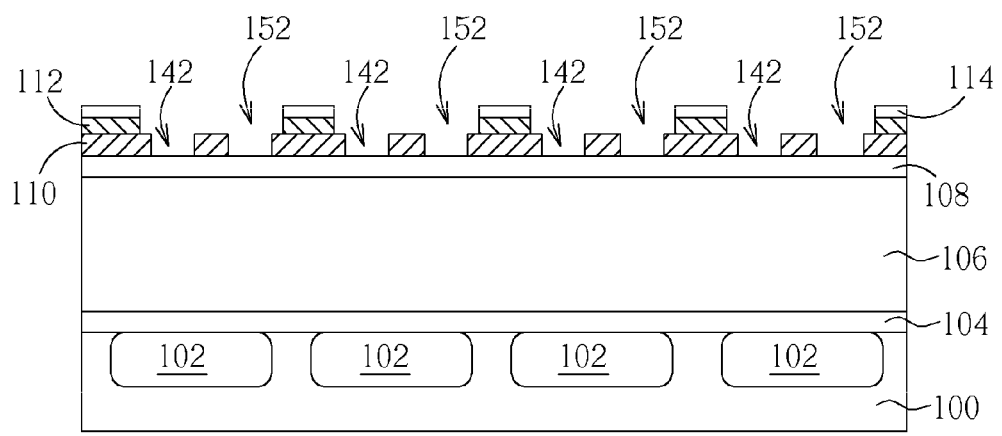

Please refer to FIGS. 7-8B, wherein FIG. 8A and FIG. 8B should be referred together in order to clearly describe the step of the preferred embodiment. After forming the first via openings 142, a fourth photoresist 150 is formed on the cap layer 114 and in the first trench openings 122 and the second trench openings 132. Next, a fourth photolithography step is performed to pattern the fourth photoresist 150, thus a plurality of fourth openings 150a for defining via openings of damascene structures is obtained as shown in FIG. 7. Then, a fourth etching step is performed to etch the first hard mask layer 110 through the fourth openings 150a with $CH_3F$ gas. Consequently, the fourth openings 150a are transferred to the first hard mask layer 110 and a plurality of second via openings 152 is formed as shown in FIG. 8A and FIG. 8B. It is noteworthy that $CH_3F$ gas is used in both the third etching step and the fourth etching step because its etching rate to the first hard mask layer 110 (including SiON in the preferred embodiment) is significantly different from its etching rate to the cap layer 108 (including TEOS in the preferred embodiment), and thus both the third etching step and the fourth etching step spontaneously stop at the cap layer 108 as shown in FIG. 6B and FIG. 8B. However, those skilled in the art would easily realize that suitable etching gas or etchant that having different etching rates between the first hard mask layer 110 and the cap layer 108 can be used in the third etching step and the fourth etching step. Additionally, the fourth photoresist 150 is consumed and removed from the substrate 100 during the fourth etching step, or is removed after the fourth etching step.

Please refer to FIG. 8A and FIG. 8B again. According to the preferred embodiment, the second double patterning process is performed to form the first via openings 142 and the second via openings 152 in the first hard mask layer 110, thus the cap layer 108 is exposed respectively in bottoms of the first via openings 142 and the second via openings 152 as shown in FIG. 8B. The first via openings 142 and the second via openings 152 are staggered as shown in FIG. 8A. In other words, a second via opening 152 is positioned between any adjacent first via openings 142 and a first via opening 142 is positioned between any adjacent second via openings 152.

Please still refer to FIG. 8A. It is noteworthy that according to the preferred embodiment, the second via openings 152 are formed in the second end 122b of the first trench openings 122 and the second end 132b of the second trench openings 132. Since the first trench openings 122 and the second trench openings 132 are arranged in a matrix, a connecting line of the second via openings 152 in any column comprises a piecewise linear line as shown in FIG. 8A.

Figure 9:
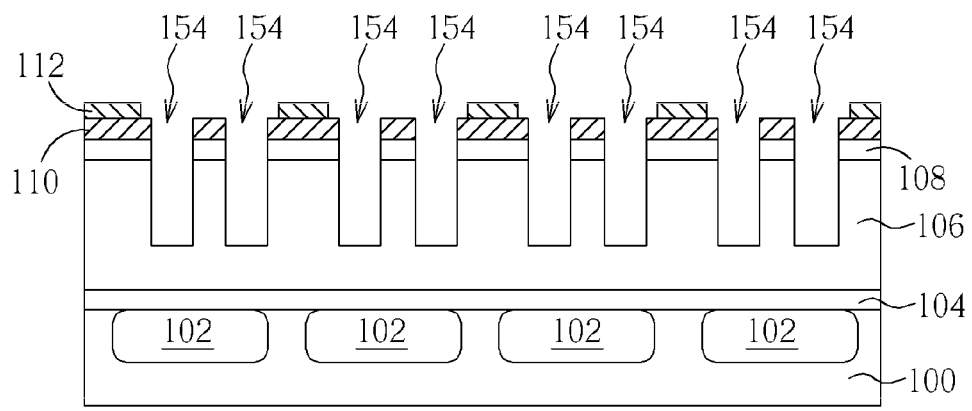

Please refer to FIG. 9. Next, a fifth etching step is subsequently performed with a first carbon and fluorine containing etchant having a high ratio of carbon atoms to fluorine atoms (hereinafter abbreviated as C/F ratio). The first carbon and fluorine containing etchant can include material selected from the group consisting of hexafluorobutadiene, octafluorocyclobutane, and perfluorocyclopentene. The fifth etching step is performed to etch the bottoms of the first via openings 142 and the second via openings 152. Thus a plurality of partial via 154 is formed in the dielectric layer 106. It is noteworthy that since an etching rate of the first carbon and fluorine containing etchant, which possesses higher C/F ratio, to TiN and SiON (that are the second hard mask layer 112 and the first hard mask layer 110) is much lower than its etching rate to TEOS and the low-K material (that are the cap layer 108 and the dielectric layer 106), the cap layer 108 and the dielectric layer 106 covered by the first hard mask layer 110 and the second hard mask layer 112 are protected from the first carbon and fluorine containing etchant during the fifth etching step.

Figure 10:
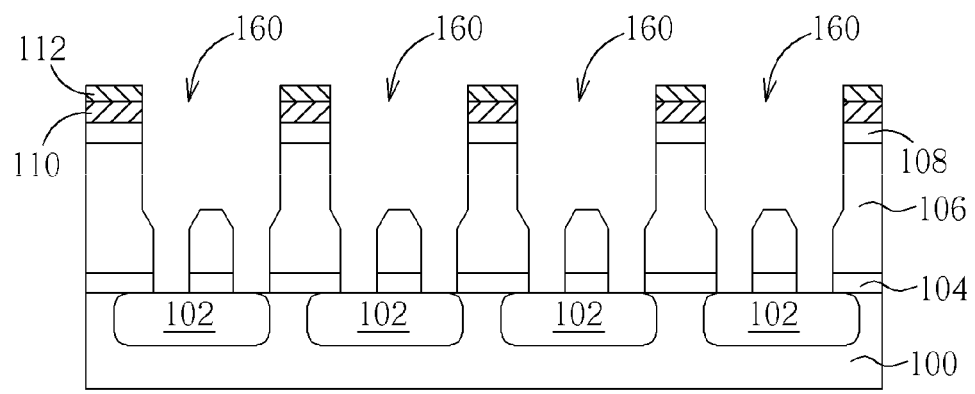

Please refer to FIG. 10. After forming the partial via 154, a sixth etching step is performed with a second carbon and fluorine containing etchant. A C/F ratio of the second carbon and fluorine containing etchant is lower than the C/F ratio of first carbon and fluorine containing etchant. Exemplarily, the second carbon and fluorine containing etchant can include materials selected from the group consisting of perfluoromethane and hexafluoroethan. Since an etching rate of the second carbon and fluorine containing etchant, which possesses lower C/F ratio, to TiN (that is the second hard mask layer 112) is much lower than its etching rate to SiON, TEOS, and the low-K materials (that are the first hard mask layer 110, the cap layer 108 and the dielectric layer 106), the sixth etching step is performed to remove the first hard mask layer 110, the cap layer 108, and the dielectric layer 106 not covered by the second hard mask layer 112. Consequently, the first trench openings 122, the second trench openings 132, and the partial via 154 (including the first via openings 142 and the second via openings 152) are all transferred to the dielectric layer 106 and thus a plurality of damascene openings 160 is formed. As shown in FIG. 10, by transferring the first trench openings 122, the second trench openings 132, the first via openings 142, and the second via openings 152 to the dielectric layer 106 by the sixth etching step, the base layer 104 can be simultaneously removed. Or, the base layer 104 can be removed by another suitable etchant after the sixth etching step. Thus the conductive layer 102 is exposed in bottoms of the damascene openings 160.

Furthermore, after forming the damascene openings 160, a barrier layer (not shown) and a conductive layer (not shown) filling up the damascene openings 160 are sequentially formed in the damascene openings 160 and followed by performing a planarization to remove the unnecessary conductive layer and second hard mask layer 112. Thus, dual damascene structures are obtained. Since those steps are well-known to those skilled in the art, the details are omitted from the preferred embodiment in the interest of brevity.

According to the manufacturing method for a dual damascene structure provided by the first preferred embodiment of the present invention, the first trench openings and the second trench openings of the damascene openings are sequentially formed by performing the double patterning process. In the same concept, the first via openings and the second via openings of the damascene openings are also sequentially formed by performing the double patterning process. More important, the first trench openings and the second trench opening provided by the present invention are staggered, and the first via openings and the second via openings are also staggered. Therefore the minimum spaces between the first trench openings and between the second trench openings are increased. In the same concept, the minimum spaces between the first via openings and between the second via openings are also increased. Therefore pattern failure such as the trench openings connecting issue and/or the via openings connecting issue are avoided even the minimum space between the adjacent trench openings and minimum space between the adjacent via openings are kept shrinking. Simultaneously, the pattern accuracy is improved.

Figure 11:
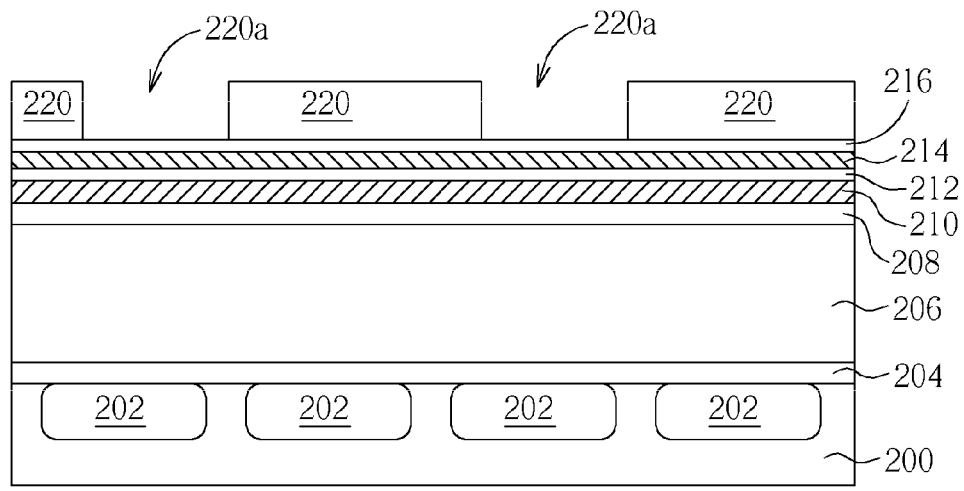
Figure 16A:
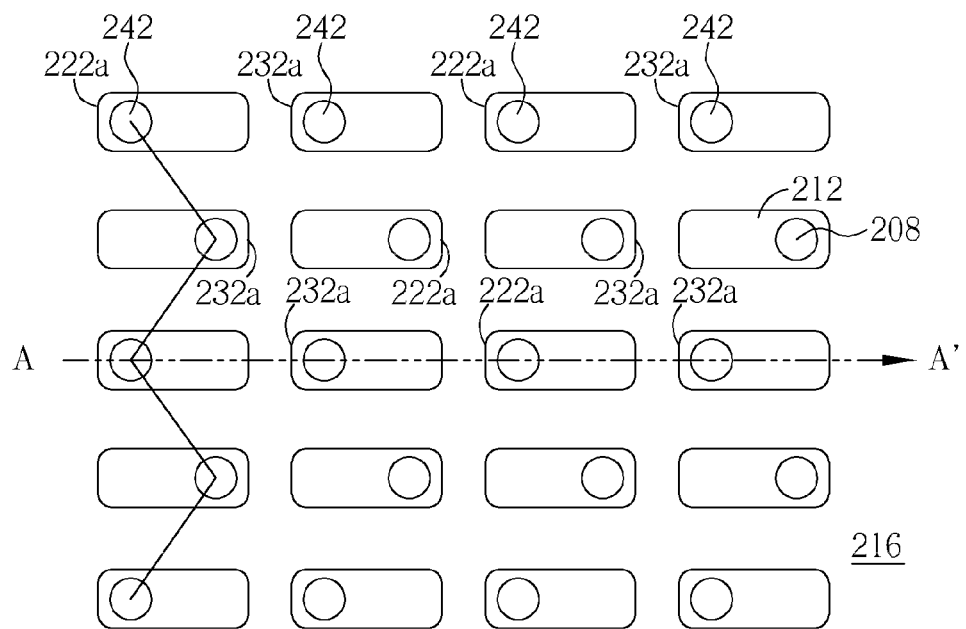
Figure 16B:
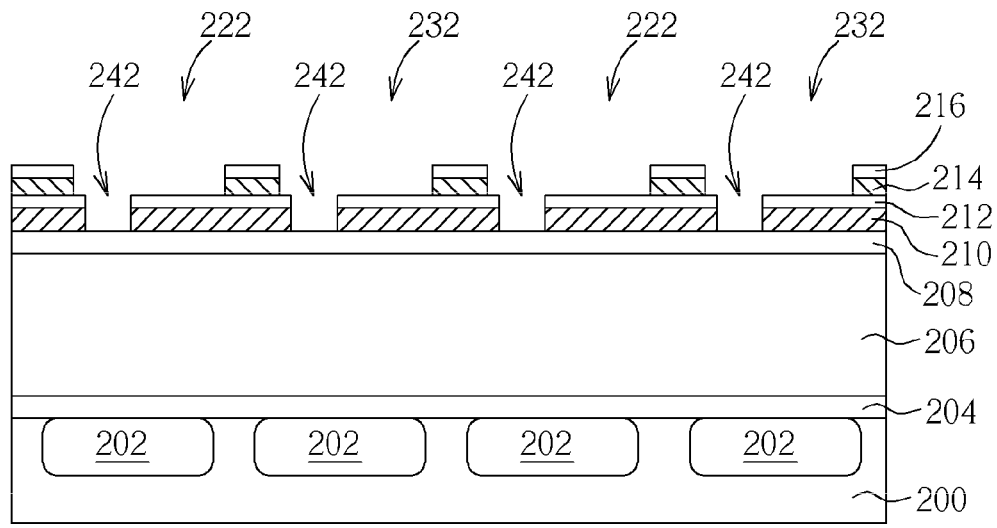
Figure 17:
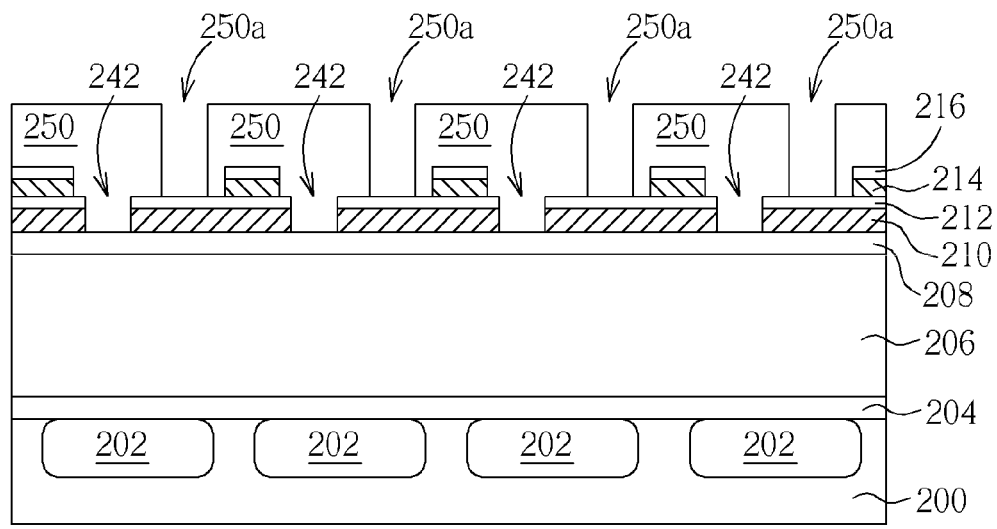
Figure 18A:
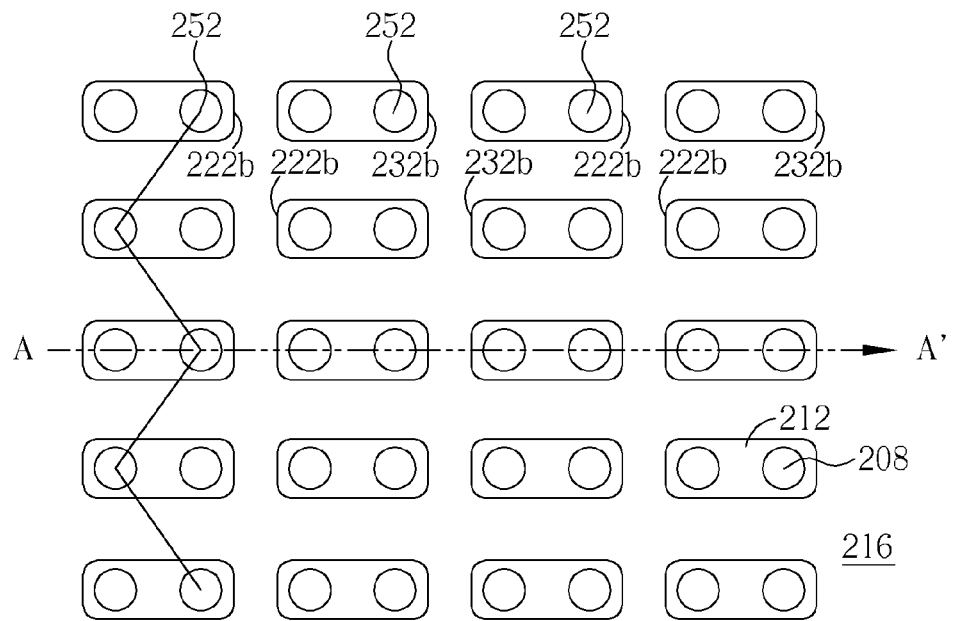

Please refer to FIGS. 11-21, which are schematic drawings illustrating a method for manufacturing a dual damascene structure provided by a second preferred embodiment of the invention, wherein FIGS. 12B, 14B, 16B, and 18B are cross-sectional view respectively taken along line A-A' of FIGS. 12A, 14A, 16A, and 18A and FIGS. 19-21 are cross-sectional view respectively taken along line A-A' of FIG. 18A. As shown in FIG. 11, the preferred embodiment provides a substrate 200 having a plurality of conductive layers 202 formed therein. And a base layer 204 covering the conductive layers 202 is formed on the substrate 200. Subsequently, a dielectric layer 206, a first hard mask layer 210, a first cap layer 212, a second hard mask layer 214, and a second cap layer 216 are sequentially formed on the substrate 200. The dielectric layer 206 can include low-K material, ULK material, or porous ULK material. Because the low-K material, the ULK material, and the porous ULK material are not dense material and all possess low structural strengths, a dense bottom cap layer 208 is preferably formed between the dielectric layer 206 and the first hard mask layer 210. The bottom cap layer 208 can be a single-layered structure including SiO, SiON, or TEOS, or a multi-layered structure.

Please refer to FIG. 11 again. In accordance with the preferred embodiment, etching rates of the first hard mask layer 210 and the second hard mask layer 214 are different from etching rates of first cap layer 212 and the second cap layer 216. For example, the first cap layer 212 and the second cap layer 216 include insulating material such as a SiON or SiO while the first hard mask layer 210 and the second hard mask layer 214 include TiN, Ti/TiN, or Ta/TaN.

Figure 12A:
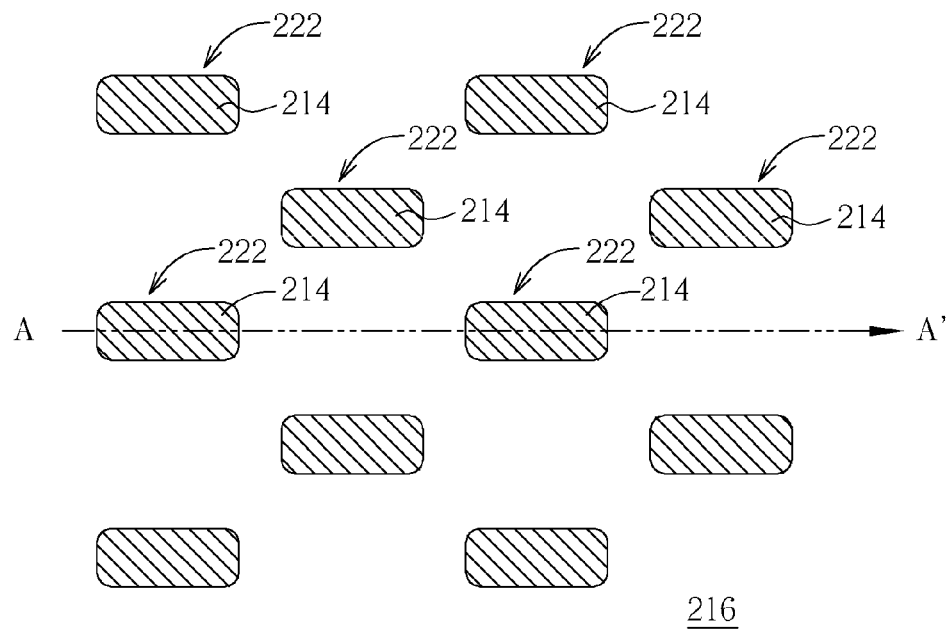
Figure 12B:
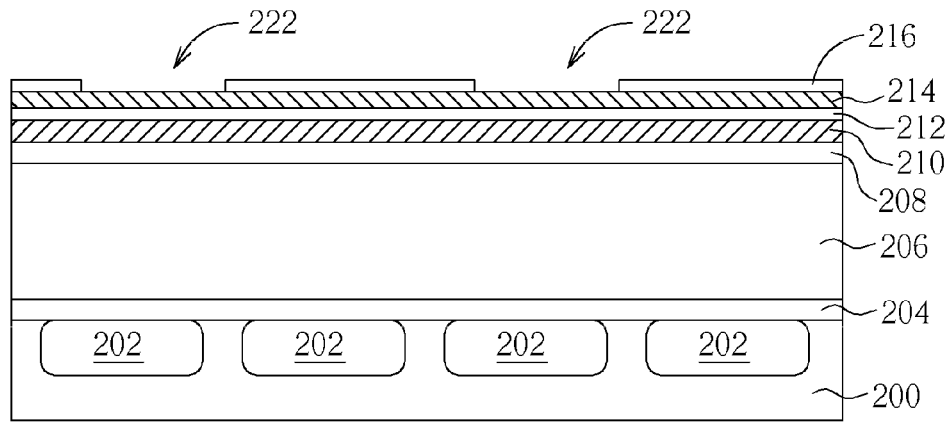
FIGS. 12B, 14B, 16B, and 18B are cross-sectional view respectively taken along line A-A' of FIGS. 12A, 14A, 16A, and 18A and FIGS. 19-21 are cross-sectional view respectively taken along line A-A' of FIG. 18A.

Please refer to FIGS. 11-12B. In order to clearly describe the step of the preferred embodiment, FIG. 12A and FIG. 12B should be referred together. Next, a first double patterning process is performed. In detail, a first photoresist 220 is formed on the second cap layer 216 and followed by performing a first photolithography step to pattern the first photoresist 220. Thus a plurality of first openings 220a for defining trench openings of damascene structures is obtained. Then, a first etching step is performed to etch the second cap layer 216 and consequently the first openings 220a are transferred to the second cap layer 216 to form a plurality trench openings 222 with the second hard mask layer 214 exposed in bottoms of the first trench openings 222 as shown in FIG. 12A and FIG. 12B. According to the preferred embodiment, the first etching step spontaneously stops at the second hard mask layer 214 as shown in FIG. 12B because the etching rate of the second cap layer 216 is different from that of the second hard mask layer 214. Additionally, the first photoresist 220 is consumed and removed from the substrate 200 during the first etching step or is removed after the first etching step by a plasma asher.

Figure 13:
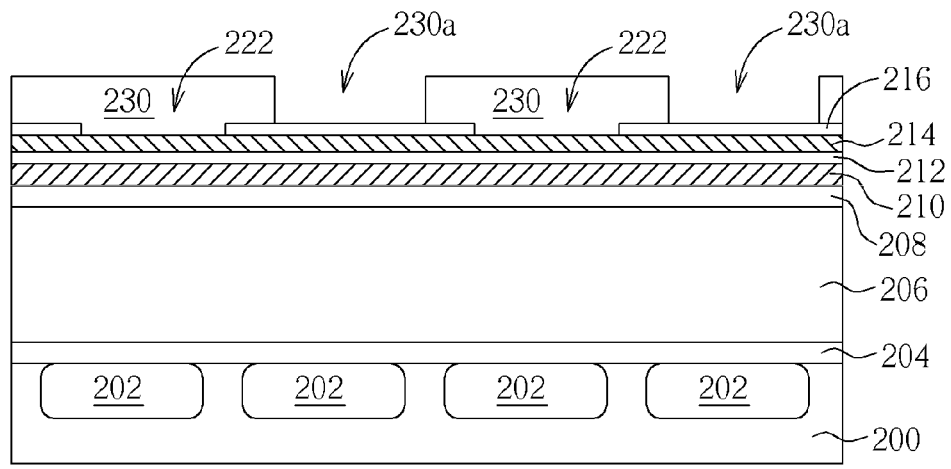
Figure 14A:
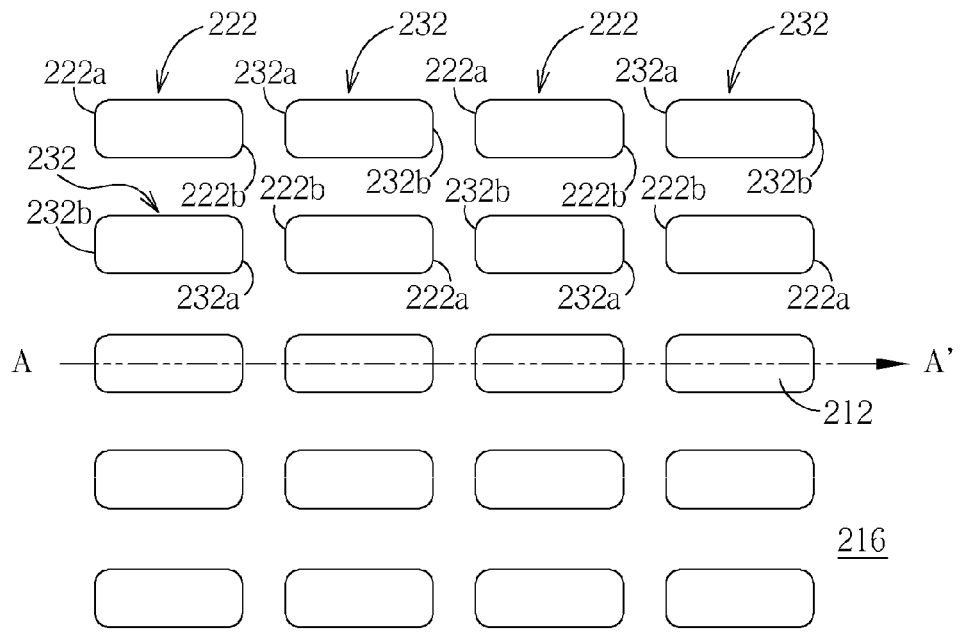
Figure 14B:
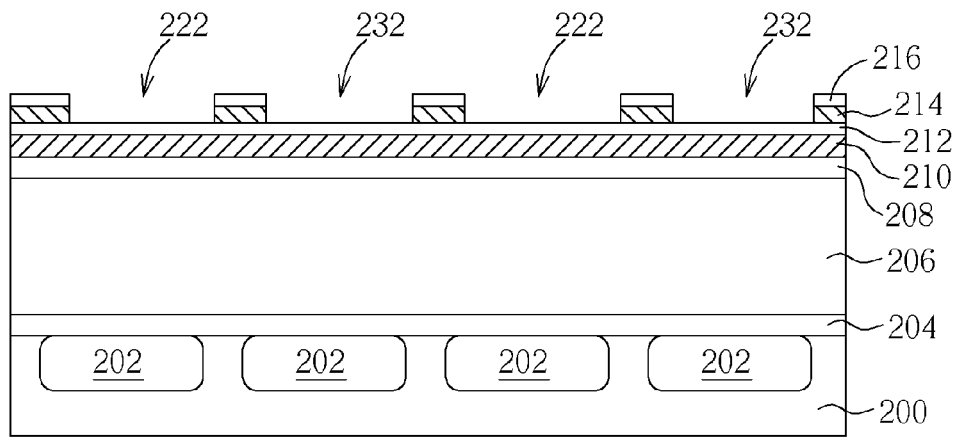

Please refer to FIGS. 13-14B, wherein FIG. 14A and FIG. 14B should be referred together in order to clearly describe the step of the preferred embodiment. After forming the first trench openings 222, a second photoresist 230 is formed on the substrate 200 and followed by performing a second photolithography step. Thus the second photoresist 230 is patterned to form a plurality of second openings 230a for defining trench openings of damascene structures as shown in FIG. 13. Next, a second etching step is performed to etch the second cap layer 216 and thus the second openings 230a are transferred to the second cap layer 216 to form a plurality of second trench openings 232. As mentioned above, the second etching step spontaneously stops at the second hard mask layer 214 because the etching rate of the second cap layer 216 is different from that of the second hard mask layer 214. Additionally, the second photoresist 230 is consumed and removed from the substrate 200 during the second etching step or after the second etching step by a plasma asher. Then, the first trench openings 222 and the second trench openings 232 are transferred to the second hard mask layer 214 with proper process. Accordingly, the second cap layer 216 and the second hard mask layer 214 include the first trench openings 222 and the second trench openings 232 with the first cap layer 212 exposed in bottoms of the first trench openings 222 and the second trench openings 232 as shown in FIG. 14A and FIG. 14B.

Please still refer to FIG. 14A. It is noteworthy that the first trench openings 222 and the second trench openings 232 are arranged in a matrix as shown in FIG. 14A. More important, the first trench openings 222 and the second trench openings 232 are staggered. In other words, a second trench opening 232 is positioned between any adjacent first trench openings 222 in any rows or columns. In the same concept, a first trench opening 222 is positioned between any adjacent second trench openings 232 in any rows or columns. It is noteworthy that after the first double patterning process, a first end 222a of the first trench opening 222 and a second end 222b of the first trench opening 222 are further defined as shown in FIG. 14A. In the same concept, a first end 232a of the second trench opening 232 and a second end 232b of the second trench opening 232 are further defined as shown in FIG. 14A. More important, the first end 222a of each first trench opening 222 is corresponding to the second end 232b of each second trench opening 232, and the second end 222b of each first trench opening 222 is corresponding to the first end 232a of the second trench opening 232 according to the preferred embodiment.

Figure 15:
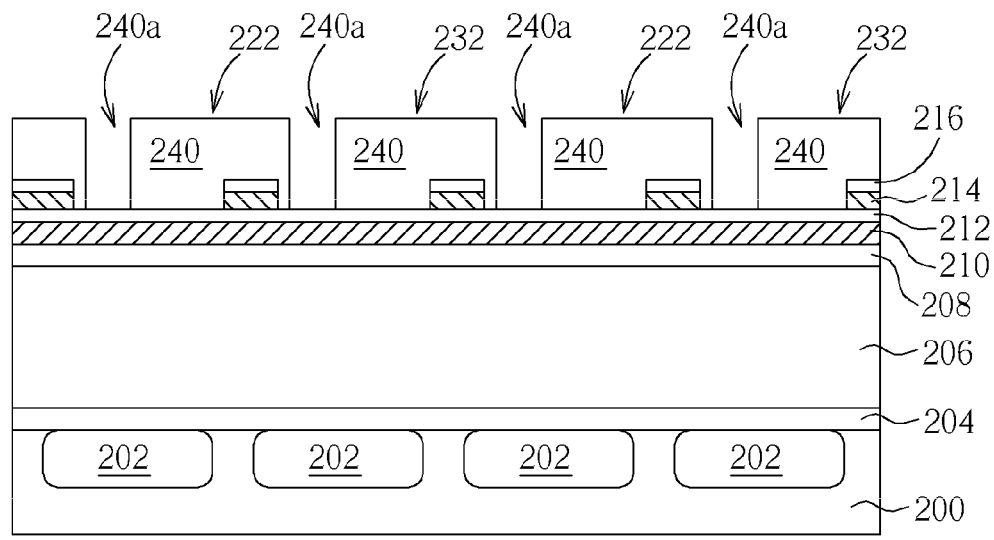

Please refer to FIGS. 15-16B, wherein FIG. 16A and FIG. 16B should be referred together in order to clearly describe the step of the preferred embodiment. After the first double patterning process, a second double patterning process is performed. In detail, a third photoresist 240 is formed on the substrate 200. Next, a third photolithography step is performed to form a plurality of third openings 240a for defining via openings of damascene structures in the third photoresist 240 as shown in FIG. 15. Subsequently, a third etching step is performed to etch the first cap layer 212 and the first hard mask layer 210 through the third openings 240a. Thus the third openings 240a are transferred to the first cap layer 212 and the first hard mask layer 210 and to form a plurality of first via openings 242 as shown in FIG. 16A and FIG. 16B. Additionally, the third photoresist 240 is consumed and removed from the substrate 200 during the third etching step, or is removed after the third etching step by a plasma asher.

Please refer to FIG. 16A again. It is noteworthy that according to the preferred embodiment, all of the first via openings 242 are formed in the first end 222a of the first trench openings 222 and the first end 232a of the second trench openings 232. Since the first trench openings 222 and the second trench openings 232 are arranged in a matrix, a connecting line of the first via openings 242 in any column comprises a piecewise linear line as shown in FIG. 16A.

Figure 18B:
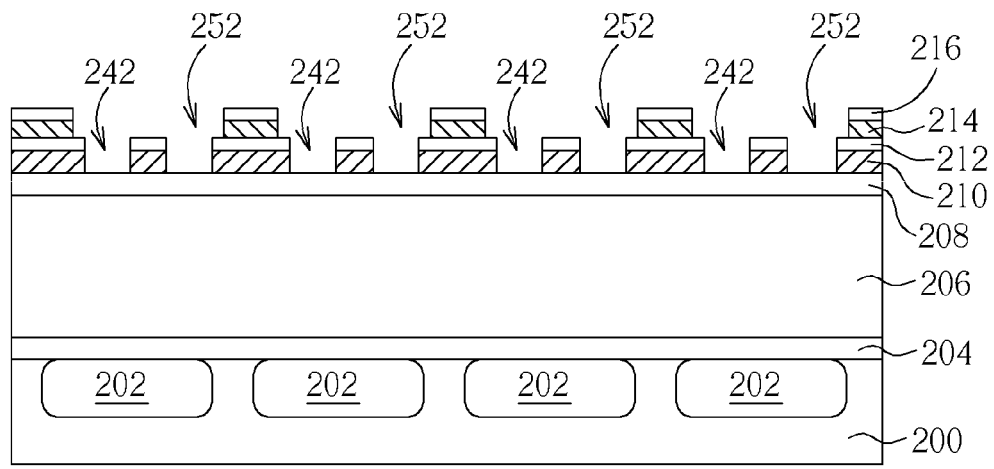

Please refer to FIGS. 17-18B, wherein FIG. 18A and FIG. 18B should be referred together in order to clearly describe the step of the preferred embodiment. After forming the first via openings 242, a fourth photoresist 250 is formed on the substrate 200. Next, a fourth photolithography step is performed to pattern the fourth photoresist 250, thus a plurality of fourth openings 250a for defining via openings of damascene structures is obtained as shown in FIG. 17. Then, a fourth etching step is performed to etch the first cap layer 212 and the first hard mask layer 210 through the fourth openings 250a. Consequently, the fourth openings 250a are transferred to the first cap layer 212 and the first hard mask layer 210 to form a plurality of second via openings 252 as shown in FIG. 18A and FIG. 18B. Please note that the first via openings 242 can be formed only in the first cap layer 212 with the first hard mask layer 210 exposed in the bottom of the first via openings 242 after the third photolithography and the third etching steps. And the first via openings 242 are transferred to the first hard mask layer 210 by the fourth etching step as shown in FIG. 18A and FIG. 18B. It is noteworthy that both the third etching step ad the fourth etching step spontaneously stop at the bottom cap layer 208 as shown in FIG. 16B and FIG. 18B because the etching rate of the first hard mask layer 210 is different from that of the bottom cap layer 208. Additionally, the fourth photoresist 250 is consumed and removed from the substrate 200 during the fourth etching step, or is removed after the fourth etching step.

Please refer to FIG. 18A and FIG. 18B again. According to the preferred embodiment, the second double patterning process is performed to form the first via openings 242 and the second via openings 252 in the cap layer 212 and the first hard mask layer 210, thus the bottom cap layer 208 is exposed respectively in bottoms of the first via openings 242 and the second via openings 252 as shown in FIG. 18B. The first via openings 242 and the second via openings 252 are staggered as shown in FIG. 18A. In other words, a second via opening 252 is positioned between any adjacent first via openings 242 and a first via opening 242 is positioned between any adjacent second via openings 252.

Please still refer to FIG. 18A. It is noteworthy that according to the preferred embodiment, the second via openings 252 are formed in the second end 222b of the first trench openings 222 and the second end 232b of the second trench openings 232. Since the first trench openings 222 and the second trench openings 232 are arranged in a matrix, a connecting line of the second via openings 252 in any column comprises a piecewise linear line as shown in FIG. 18A.

Figure 19:
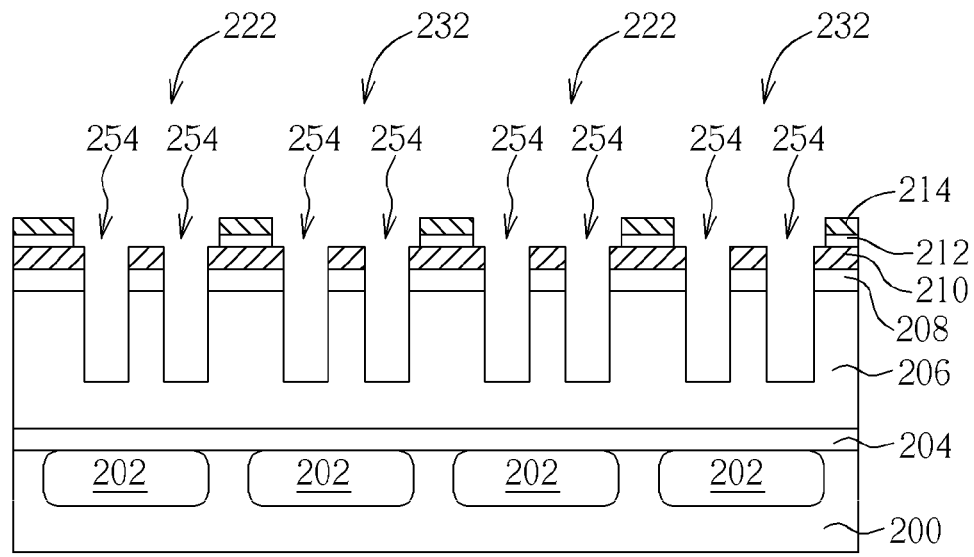

Please refer to FIG. 19. Next, a fifth etching step is subsequently performed to etch the bottoms of the first via openings 242 and the second via openings 252. Thus a plurality of partial via 254 is formed in the bottom cap layer 208 and the dielectric layer 206. It is noteworthy that because the second cap layer 216 and the first cap layer 212 include insulating materials as the bottom cap layer 208 and the dielectric layer 206, the second cap layer 216 and the first cap layer 212 exposed to the etchant are removed during the fifth etching step.

Figure 20:
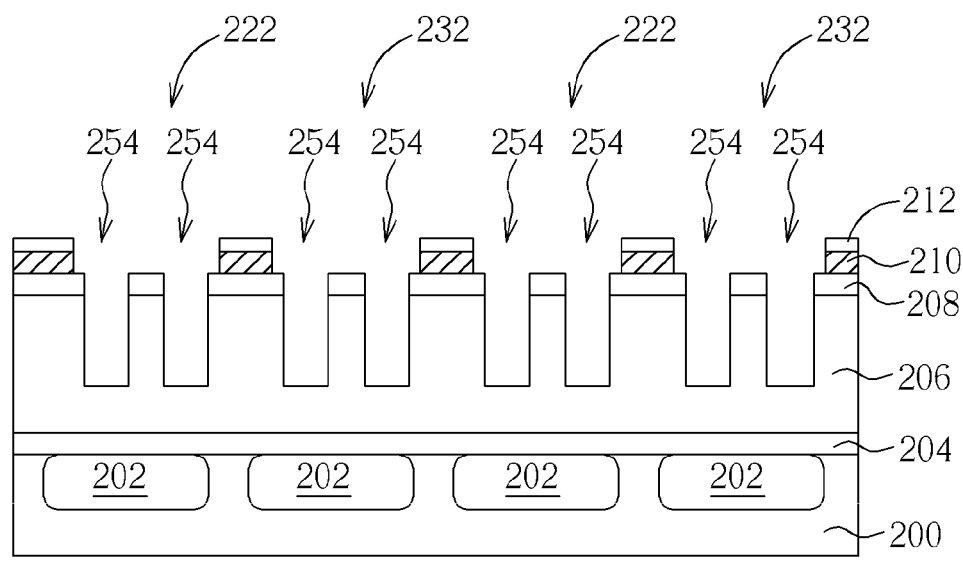

Please refer to FIG. 20. After forming the partial via 254, a sixth etching step is performed. The sixth etching step can be formed with a dry etching method such as a $Cl_2$ plasma etching method or a wet etching method using a proper etchant such as a carbon and fluorine containing etchant. For example, a ratio of carbon atoms to fluorine atoms (hereinafter abbreviated as C/F ratio) of the carbon and fluorine containing etchant is low in the preferred embodiment. Exemplarily but not limited to, the carbon and fluorine containing etchant can include materials selected from the group consisting of perfluoromethane and hexafluoroethan. It is noteworthy that an etching rate of the carbon and fluorine containing etchant, which possesses lower C/F ratio, to TiN (that are the first hard mask layer 210 and the second hard mask layer 214) is much higher than its etching rate to SiON, TEOS, and the low-K materials (that are the first cap layer 212, the bottom cap layer 208 and the dielectric layer 206), therefore the sixth etching step is performed to remove the second hard mask layer 214 and the first hard mask layer 210 exposed to the etchant. Consequently, the first trench openings 222 and the second trench openings 232 are transferred from the second hard mask layer 214 to the first hard mask layer 210 as shown in FIG. 20.

Figure 21:
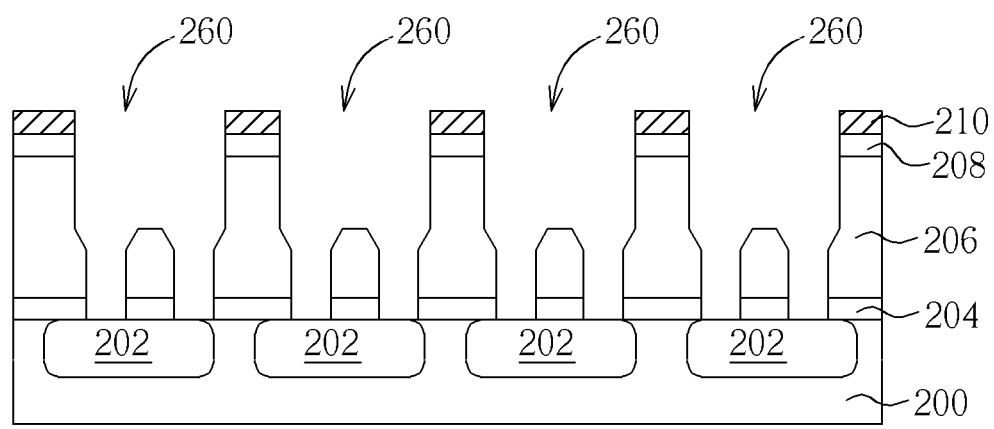

Please refer to FIG. 21. Then, a seventh etching step is performed with the first cap layer 212 and the bottom cap layer 208 serving as an etching mask. Thus, the first trench openings 222, the second trench openings 232, and the partial via 254 (including the first via openings 242 and the second via openings 252) are all transferred to the dielectric layer 206 and thus a plurality of damascene openings 260 is formed. Please note that the first cap layer 212 can be removed during the seventh etching step as shown in FIG. 21. In addition, during transferring the first trench openings 222, the second trench openings 232, the first via openings 242, and the second via openings 252 to the dielectric layer 206 by the seventh etching step, the base layer 204 can be simultaneously removed. Or, the base layer 204 can be removed by another suitable etchant after the sixth etching step. Thus the conductive layer 202 is exposed in bottoms of the damascene openings 260.

Furthermore, after forming the damascene openings 260, a barrier layer (not shown) and a conductive layer (not shown) filling up the damascene openings 260 are sequentially formed in the damascene openings 260 and followed by performing a planarization to remove the unnecessary conductive layer and the remained first hard mask layer 210. Thus, dual damascene structures are obtained. Since those steps are well-known to those skilled in the art, the details are omitted from the preferred embodiment in the interest of brevity.

According to the manufacturing method for a dual damascene structure provided by the second preferred embodiment of the present invention, the dielectric layer is protected from the plasma asher that is required for removing the photoresists because the photoresists are all removed before forming the partial vias in the dielectric layer. Therefore the strength of the dielectric layer remains unimpaired. Furthermore, because the preferred embodiment provides a bi-layered hard mask layer with a cap layer sandwiched therebetween, the trench openings can be faithfully transferred from the second hard mask layer, to the first hard mask layer, and to the dielectric layer due to the high selectivity between the hard mask layer and other materials. Accordingly, since the reliability of the process in improved, the size of the trenches can be further minimized without losing the pattern transferring accuracy. In addition, since the first trench openings and the second trench openings of the damascene openings are sequentially formed by performing the double patterning process as mentioned above, and the first trench openings and the second trench opening provided by the present invention are staggered, and the first via openings and the second via openings are also staggered, the minimum spaces between the first trench openings and between the second trench openings are increased. In the same concept, the minimum spaces between the first via openings and between the second via openings are also increased. Therefore pattern failure such as the trench openings connecting issue and/or the via openings connecting issue are avoided even the minimum space between the adjacent trench openings and minimum space between the adjacent via openings are kept shrinking. Simultaneously, the pattern accuracy is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method for a dual damascene structure, comprising steps of:
   providing a substrate having at least a dielectric layer, a first hard mask layer, a first cap layer, a second hard mask layer, and a second cap layer sequentially formed thereon;
   performing a first double patterning process to sequentially form a plurality of first trench openings and a plurality of second trench openings in the second cap layer and the second hard mask and expose the first cap layer, wherein the first trench openings respectively comprise a first end of the first trench opening and a second end of the first trench opening, and the second trench openings respectively comprise a first end of the second trench opening and a second end of the second trench opening;
   performing a second double patterning process to sequentially form a plurality of first via openings and a plurality of second via openings in the first cap layer and the first hard mask layer; and
   transferring the first trench openings, the second trench openings, the first via openings, and the second via openings to the dielectric layer to form a plurality of dual damascene openings.

2. The manufacturing method for a dual damascene structure according to claim 1, wherein the substrate further comprises at least a conductive layer and a base layer covering the conductive layer.

3. The manufacturing method for a dual damascene structure according to claim 2, wherein the base layer is exposed in bottoms of damascene openings.

4. The manufacturing method for a dual damascene structure according to claim 1, wherein the substrate further comprises a bottom cap layer formed between the dielectric layer and the first hard mask layer.

5. The manufacturing method for a dual damascene structure according to claim 1, wherein the first cap layer and the second cap layer comprise silicon oxide or silicon oxynitride.

6. The manufacturing method for a dual damascene structure according to claim 1, wherein the first hard mask layer and the second hard mask layer comprise titanium nitride (TiN), Ti/TiN, or Ta/TaN.

7. The manufacturing method for a dual damascene structure according to claim 1, wherein the first double patterning process further comprises steps of:
forming a first photoresist on the second cap layer;
sequentially performing a first photolithography step and a first etching step to form the first trench openings in the second cap layer;
forming a second photoresist on the substrate;
sequentially performing a second photolithography step and a second etching step to form the second trench openings in the second cap layer;
removing the second photoresist; and
transferring the first trench openings and the second trench openings to the second hard mask layer, the first trench openings and the second trench openings being staggered.

8. The manufacturing method for a dual damascene structure according to claim 1, wherein the second double patterning process further comprises steps of:
forming a third photoresist on the substrate;
sequentially performing a third photolithography step and a third etching step to form the first via openings in the first cap layer and the first hard mask layer;
forming a fourth photoresist on the substrate; and
sequentially performing a fourth photolithography step and a fourth etching step to form the second via openings in the first cap layer and the first hard mask layer, the first via openings and the second via openings being staggered.

9. The manufacturing method for a dual damascene structure according to claim 1, wherein the first trench openings and the second trench opening are arranged in a matrix.

10. The manufacturing method for a dual damascene structure according to claim 1, wherein the first end of the first trench opening is corresponding to the second end of the second trench opening and the second end of the first trench opening is corresponding to the first end of the second trench opening.

11. The manufacturing method for a dual damascene structure according to claim 10, wherein the first via opening is positioned in the first end of the first trench opening and the first end of the second trench opening, and the second via opening is positioned in the second end of the first trench opening and the second end of the second trench opening.

12. The manufacturing method for a dual damascene structure according to claim 11, wherein a connecting line of the first via openings comprises a piecewise linear line and a connecting line of the second via openings comprises a piecewise linear line.

13. The manufacturing method for a dual damascene structure according to claim 1, wherein the step of forming the damascene openings further comprises steps of:
performing a fifth etching step to etch bottoms of the first via openings and the second via openings to form a plurality of partial via in the dielectric layer;
performing a sixth etching step to transfer the first trench openings and the second trench openings to the first hard mask layer; and
performing a seventh etching step to form the damascene openings in the dielectric layer.

14. The manufacturing method for a dual damascene structure according to claim 13, wherein the second cap layer is removed from the substrate during the fifth etching step.

15. The manufacturing method for a dual damascene structure according to claim 13, wherein the sixth etching step is performed with a carbon and fluorine containing etchant.

16. The manufacturing method for a dual damascene structure according to claim 15, wherein the carbon and fluorine containing etchant comprises materials selected from the group consisting of perfluorocyclopentene and hexafluoroethane.

17. The manufacturing method for a dual damascene structure according to claim 13, wherein the sixth etching step comprises a dry etching step.

* * * * *